United States Patent
Tsukao

(10) Patent No.: US 9,980,375 B2
(45) Date of Patent: May 22, 2018

(54) CONNECTION BODY, METHOD FOR MANUFACTURING A CONNECTING BODY AND INSPECTION METHOD THEREOF

(71) Applicant: DEXERIALS CORPORATION, Tokyo (JP)

(72) Inventor: Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days. days.

(21) Appl. No.: 15/119,195

(22) PCT Filed: Feb. 26, 2015

(86) PCT No.: PCT/JP2015/055548
§ 371 (c)(1),
(2) Date: Aug. 16, 2016

(87) PCT Pub. No.: WO2015/129792
PCT Pub. Date: Sep. 3, 2015

(65) Prior Publication Data
US 2017/0013717 A1    Jan. 12, 2017

(30) Foreign Application Priority Data

Feb. 27, 2014  (JP) .................................. 2014-036743
Feb. 24, 2015  (JP) .................................. 2015-034548

(51) Int. Cl.
*H05K 1/02* (2006.01)
*H05K 3/00* (2006.01)
(Continued)

(52) U.S. Cl.
CPC ........... *H05K 1/0284* (2013.01); *H01L 24/81* (2013.01); *H05K 1/0269* (2013.01); *H05K 1/117* (2013.01);
(Continued)

(58) Field of Classification Search
CPC .. H05K 3/0011; H05K 3/0014; H05K 3/0017; H05K 3/0044; H05K 3/0055; H05K 1/0284
See application file for complete search history.

(56) References Cited

U.S. PATENT DOCUMENTS 4,963,002 A * 10/1990 Tagusa .................. H01L 21/563
257/E21.503

FOREIGN PATENT DOCUMENTS

JP   2004-214374 A   7/2004
JP   2005-203758 A   7/2005
(Continued)

OTHER PUBLICATIONS

May 12, 2015 International Search Report issued in International Patent Application No. PCT/JP2015/055548.
(Continued)

*Primary Examiner* — Jeremy C Norris
(74) *Attorney, Agent, or Firm* — Oliff PLC

(57) ABSTRACT

Indentation visibility is improved and quick and accurate inspection is performed after a connection step using an anisotropic conductive film. A connection body according to the present disclosure comprises a transparent substrate and an electronic component connected to the transparent substrate via an anisotropic conductive adhesive; conductive particles contained by the anisotropic conductive adhesive cause a plurality of indentations arranged in an in-plane direction of a terminal of the transparent substrate.

21 Claims, 11 Drawing Sheets

(51) Int. Cl.
  *H05K 3/32*    (2006.01)
  *H01L 23/00*   (2006.01)
  *H05K 1/11*    (2006.01)
  *H05K 1/18*    (2006.01)

(52) U.S. Cl.
  CPC ........... H05K 1/181 (2013.01); H05K 3/0011 (2013.01); H05K 3/323 (2013.01); *H01L 2224/16225* (2013.01); *H01L 2224/73204* (2013.01); *H01L 2224/83192* (2013.01); *H05K 2201/0108* (2013.01); *H05K 2201/09918* (2013.01); *H05K 2203/166* (2013.01)

(56) References Cited

FOREIGN PATENT DOCUMENTS

| | | |
|---|---|---|
| JP | 2005-227217 A | 8/2005 |
| JP | 2010-256223 A | 11/2010 |
| JP | 4789738 B2 | 10/2011 |
| JP | 2013-055331 A | 3/2013 |
| WO | 2013/089199 A1 | 6/2013 |

OTHER PUBLICATIONS

Sep. 1, 2016 International Preliminary Report on Patentability issued in International Patent Application No. PCT/JP2015/055548.

\* cited by examiner

CONNECTION BODY, METHOD FOR MANUFACTURING A CONNECTING BODY AND INSPECTION METHOD THEREOF

TECHNICAL FIELD

The present disclosure relates to a connection body in which an electronic component and a transparent substrate are connected, and more particularly relates to a connection body, a method for manufacturing a connecting body and an inspection method in which an electronic component is connected to a transparent substrate via an adhesive containing conductive particles. This application claims priority to Japanese Patent Application No. 2014-036743 filed on Feb. 27, 2014 and Japanese Patent Application No. 2015-034548 filed on Feb. 24, 2015, the entire contents of which are hereby incorporated by reference.

BACKGROUND ART

Conventionally, devices such as televisions, PC monitors, mobile phones, smart phones, portable game devices, tablet devices, wearable devices and automotive monitors, among others, have used a liquid crystal display device or an organic EL panel as a display means. In recent years, in such display devices, in view of finer pitches and thinner and lighter devices, methods using anisotropic conductive film (ACF) have been employed in which a driver IC is directly mounted onto a glass substrate of a display panel or in which a flexible substrate on which, for example, a driver IC has been formed, is directly mounted to a glass substrate.

On the glass substrate to which the IC or flexible substrate is to be mounted, a plurality of transparent electrodes comprising ITO (indium tin oxide) are formed and the electronic component such as an IC or flexible substrate are connected onto these transparent electrodes. The electronic component to be connected onto the glass substrate has electrode terminals corresponding to the transparent electrodes formed onto the mounting surface thereof and is thermocompression-bonded onto the glass substrate via an anisotropic conductive film, thereby connecting the electrode terminals to the transparent electrodes.

The anisotropic conductive film contains a binder resin into which conductive particles are dispersed and is film-formed, and by being thermocompression-bonded between two conductors, electrical conduction between the conductors is achieved by the conductive particles and mechanical connection between the conductors is ensured between the conductors by the binder resin. The adhesive constituting the anisotropic conductive film, although typically a highly reliable thermosetting binder resin is used, may be a photosetting binder resin or a thermo/photosetting binder resin.

In the case of connecting the electronic component to the transparent electrodes via such an anisotropic conductive film, the anisotropic conductive film is first temporarily bonded onto the transparent electrodes of the glass substrate by a temporary pressure bonding means which is not illustrated in the drawings. After mounting the electronic component onto the transparent substrate via the anisotropic conductive film to form a temporary connection body, a thermocompression bonding means, for example, a thermocompression bonding head, is used to hot-press the electronic component along with the anisotropic conductive film towards the transparent substrate. Heat applied by the thermocompression bonding head causes a thermosetting reaction in the anisotropic conductive film, thereby connecting the electronic component onto the transparent electrodes.

PRIOR ART LITERATURE

Patent Literatures

PLT 1: Japanese Patent No. 4789738
PLT 2: Japanese Unexamined Patent Application Publication No. 2004-214374
PLT 3: Japanese Unexamined Patent Application Publication No. 2005-203758

SUMMARY OF THE INVENTION

Problem to be Solved by the Invention

However, with such a connecting method using anisotropic conductive film, in thermocompression processes for the connection sites to which the electronic components are to be connected, thermocompression is not normally performed over a large surface area to mount a large number of mounting products together. This is due to factors including the connection site of the electronic component having a relatively small surface area in comparison to the electronic component to be connected and parallelism being required for electrode terminals (bumps) arranged in a multitude at the connection side.

Accordingly, in connecting steps using anisotropic conductive film, in view of improving productivity in addition to shorter connecting steps being desirable, in conjunction with shorter times, more rapid post-connection inspection steps are also desired.

The post-connection inspection is a step for confirming that conduction is ensured by deformation of the conductive particles by the electrode terminals of the electronic component and the transparent electrodes of the glass substrate, in relation to increasing rapidity, there is a visual inspection of observing indentations of the conductive particles appearing in the transparent electrodes via a back surface. As the post-connection inspection, by using human vision or captured image, the condition of indentations and lifting or peeling of the adhesive in the surrounding vicinity are observed.

Conditions of the indentations are compared with peripheral portions in which the conductive particles are not present and, as mechanical determination criteria, can be determined by observing differences in contrast and color. However, if the conductive particles overlap between the electrode terminals and the transparent electrodes or if the conductive particles are continuous and contact each other or are excessively proximal to each other in the in-plane direction of the transparent electrodes, in discriminating between indentations and surrounding vicinities, particularly, contrast and coloration are adversely affected such that visibility is reduced, and performing a rapid and accurate visual inspection might not be possible.

In this regard, an object of the present disclosure is to provide a connection body, a method for manufacturing a connecting body, and an inspection method which improves indentation visibility and which enables rapid and accurate post-connection inspection in connection processes using anisotropic conductive film.

Solution to Problem

In order to solve the aforementioned problems, a connection body according to the present disclosure comprises a transparent substrate; and an electronic component connected to the transparent substrate via an anisotropic conductive adhesive; wherein the transparent substrate has terminals on which a plurality of indentations caused by conductive particles contained in the anisotropic conductive adhesive are arranged in an in-plane direction of the terminals.

Furthermore, a method for manufacturing a connection body according to the present disclosure comprises mounting an electronic component onto a circuit substrate via an adhesive containing conductive particles; and pressing the electronic component against the circuit substrate and curing the adhesive, thereby connecting the electronic component onto the circuit substrate; wherein the anisotropic conductive adhesive has conductive particles arranged in a binder resin; and wherein the transparent substrate has terminals on which a plurality of indentations caused by the conductive particles are arranged in an in-plane direction of the terminals.

Still Further, an inspection method for inspecting a connection condition of a connection body in which an electronic component is connected onto a transparent substrate via an anisotropic conductive adhesive in which conductive particles are arranged comprises comparing indentations of the conductive particles contained by the anisotropic conductive adhesive appearing in terminals of the transparent substrate and a surrounding area of the indentations.

Advantageous Effects of Invention

According to the present disclosure, within the terminals, by arranging the conductive particles, individual indentations appear in an independent state. Consequently, the indentations appearing in the terminals appear with clear contrast such that significant improvements in visibility of individual indentations facilitates recognition, thereby enabling rapid and accurate inspection of connection properties between terminals of the electronic component and the transparent substrate on the basis of the indentations.

DESCRIPTION OF EMBODIMENTS

Figure 1:
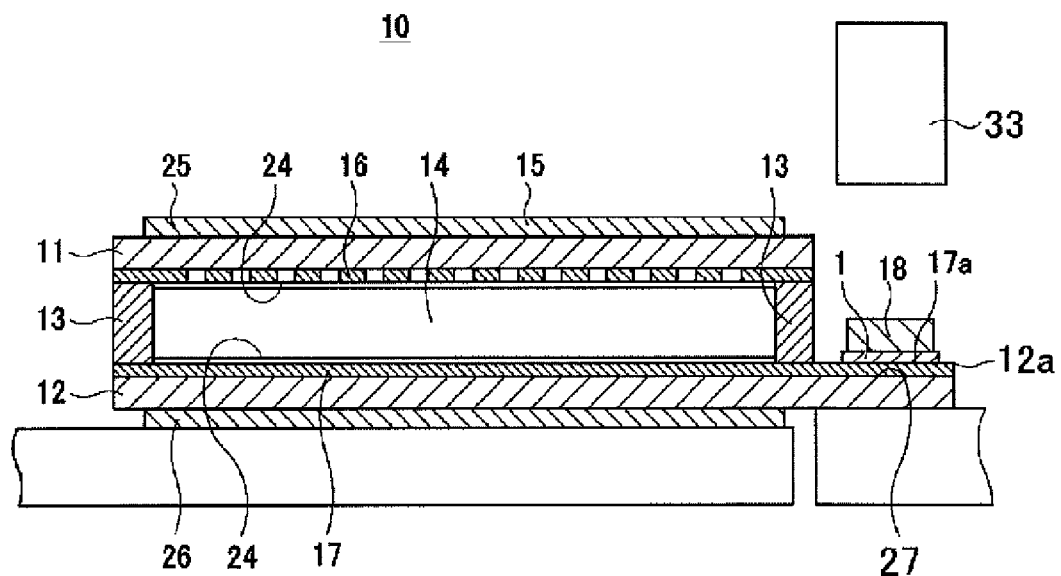
FIG. 1 is a cross-sectional view illustrating one example of a connection body of a liquid crystal display panel.

Hereinbelow, a connection body, method for manufacturing a connecting body and an inspection method according to the present disclosure will now be more particularly described with reference to the accompanying drawings. It should be noted that the present disclosure is not limited to the embodiments described below and various modifications can be made without departing from the scope of the present disclosure. The features shown in the drawings are illustrated schematically and are not intended to be drawn to scale. Actual dimensions should be determined in consideration of the following description. Moreover, those skilled in the art will appreciate that dimensional relations and proportions may be different among the drawings in some parts.

Liquid Crystal Display Panel

In the following, a liquid crystal display panel will be described as an example in which, as the connection body according to the present disclosure, a liquid crystal driver IC is mounted as the electronic component onto a glass substrate. As illustrated in FIG. 1, in a liquid crystal display panel 10, two transparent substrates 11, 12 comprising, for example, glass substrates are arranged to face each other and these transparent substrates 11, 12 are joined together by a seal 13 which is frame-shaped. In the liquid crystal display panel 10, a panel display component 15 is formed by sealing a liquid crystal 14 within a space enclosed by the transparent substrates 11, 12.

On both inner surfaces of the transparent substrates 11, 12 opposing each other, a pair of transparent electrodes 16, 17 are formed from, for example, ITO (indium tin oxide) in a stripe pattern in mutually intersecting directions. Both of the transparent electrodes 16, 17 are configured so that a pixel, as the minimum unit of the liquid crystal display, is constituted by intersecting portions of both of the transparent electrodes 16, 17.

Figure 2:
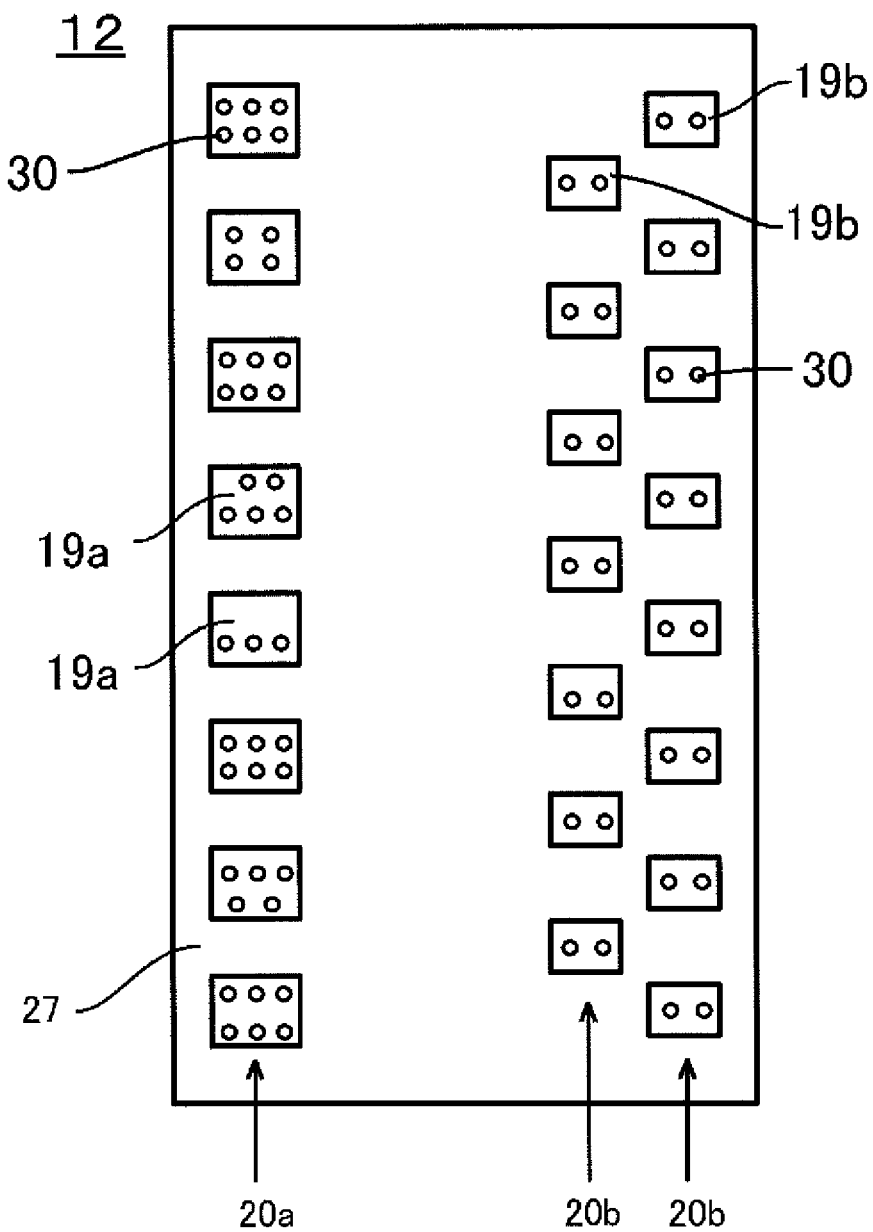
FIG. 2 is a bottom view illustrating a state of indentations appearing in input/output terminals as viewed from a back surface of a transparent substrate.
Figure 3:
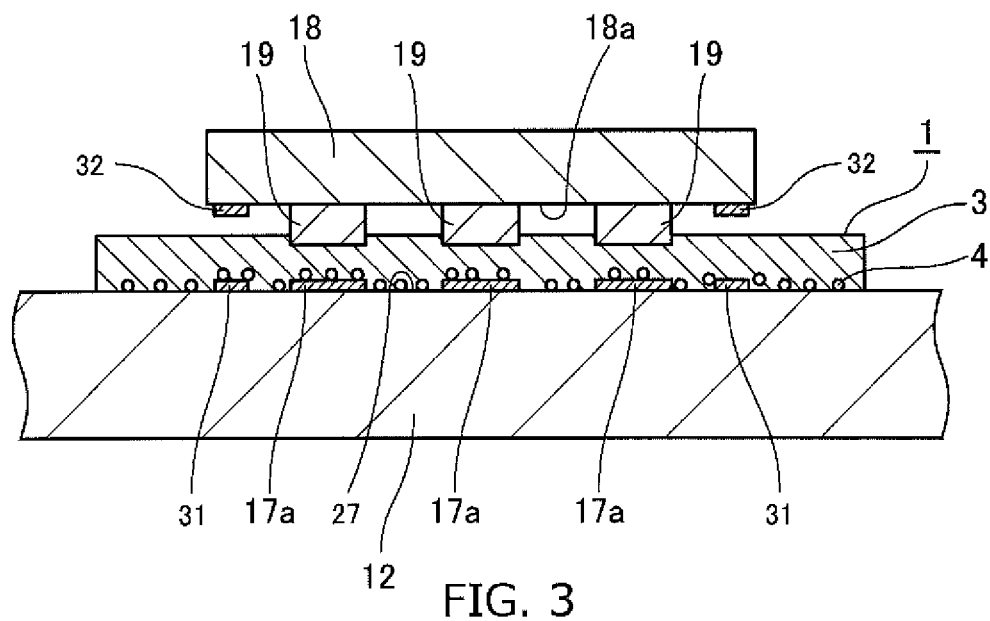
FIG. 3 is a cross-sectional view illustrating a connecting step of a liquid crystal driver IC and a transparent substrate.

Among both of the transparent substrates 11, 12, one transparent substrate 12 is formed to be larger than the other transparent substrate 11 in planar dimensions, in an edge area 12a of the transparent substrate 12 formed to be larger, a mounting site 27 is provided on which a liquid crystal driver IC 18 is mounted as the electronic component. It should be noted that, on the mounting site 27, as illustrated in FIGS. 2 and 3, an input terminal row 20a in which a plurality of input terminals 19*a* are arranged as well as an output terminal row 20*b* in which a plurality of output terminals 19*b* are arranged of the transparent electrodes 17 as well as a substrate-side alignment mark 31, which is to be aligned with an IC-side alignment mark 32 provided on the liquid crystal driver IC 18, are formed.

Figure 4:
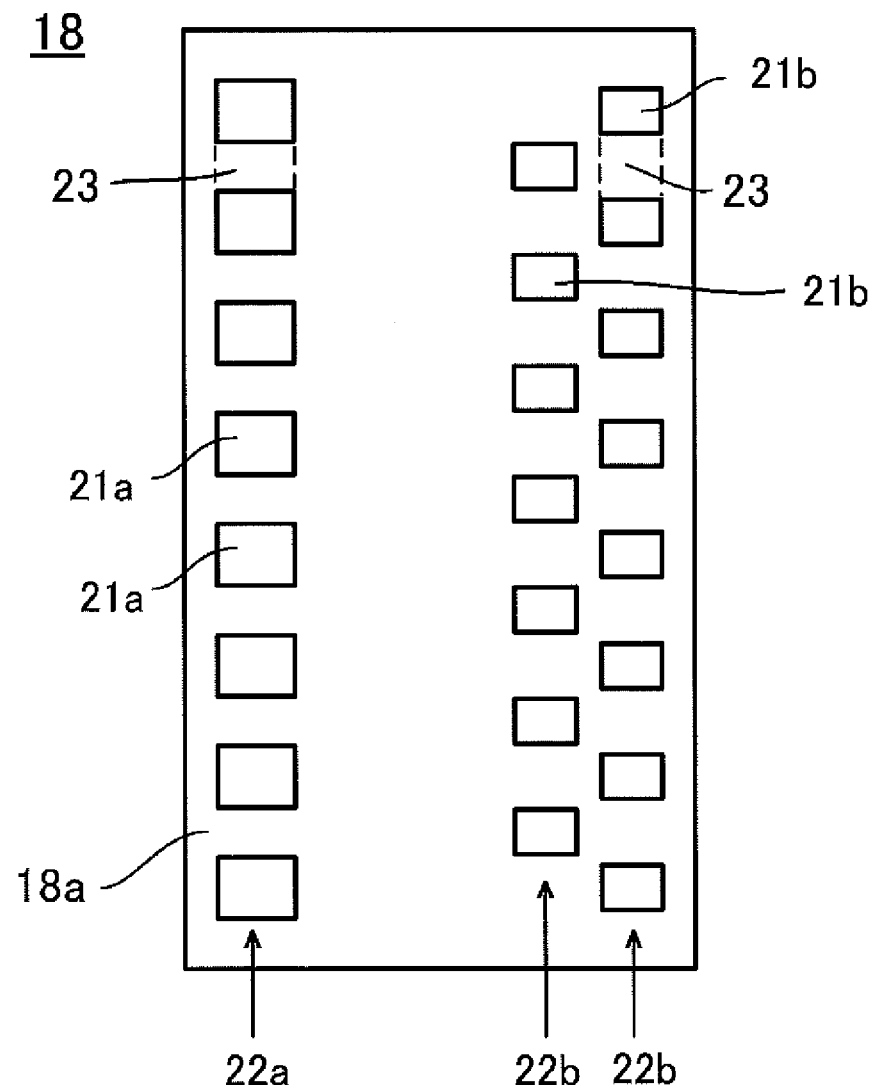
FIG. 4 is a plan view illustrating electrode terminals (bumps) and an inter-terminal space of a liquid crystal driver IC.

The liquid crystal driver IC 18, by selectively applying a liquid crystal driving voltage to the pixel, can partially change liquid crystal orientation to perform a predetermined liquid crystal display. As illustrated in FIGS. 3 and 4, the liquid crystal driver IC 18 has a mounting surface 18*a* which faces the transparent substrate 12 and on which an input bump row 22*a* in which a plurality of input bumps 21*a* are arranged for electrically connecting to the input terminals 19*a* of the transparent electrodes 17 as well as an output bump row 22*b* in which a plurality of output bumps 21*b* are arranged for electrically connecting to the output terminals 19*b* of the transparent electrodes 17 are formed. Suitable examples usable as the input bumps 21*a* and the output bumps 21*b* include copper bumps, gold bumps and gold-plated copper bumps, among others.

The input bumps 21*a*, for example, are arranged in a single row along one side edge of the mounting surface 18*a* and the output bumps 21*b* are arranged in a staggered fashion in a plurality of rows along another side edge that is opposite to the one side edge. The input/output bumps 21*a*, 21*b* as well as the input/output terminals 19*a*, 19*b* formed on the mounting site 27 of the transparent substrate 12 are formed in equal number at an equal pitch and are connected by positioning and connecting the transparent substrate 12 and the liquid crystal driver IC 18.

It should be noted that, in addition to being as illustrated in FIG. 4, any configuration in which the input/output bumps 21*a*, 21*b* are arranged in one or more rows on one side edge and one or more rows on another side edge is possible. Furthermore, in the input/output bumps 21*a*, 21*b*, a portion of one row arrangement may be made into multiple rows and a portion of multiple rows may be made into a single row. Still further, the input/output bumps 21*a*, 21*b* may be formed in a straight arrangement in which respective parallel and adjacent electrode terminals from each of multiple rows are alongside each other or may be in a staggered arrangement in which respective parallel and adjacent electrode terminals from each row are uniformly offset from each other.

Moreover, in the liquid crystal driver IC 18, along with wronging the input/output bumps 21*a*, 21*b* along the long side of the IC substrate, side bumps may also be formed along the short side of the IC substrate. It should be noted that the input/output bumps 21*a*, 21*b* may be formed to have the same dimensions and may also be formed to have differing dimensions. Furthermore, in the input/output bumps rows 22*a* and 22*b*, the input/output bumps 21*a*, 21*b* may be formed to have the same dimensions and arranged symmetrically or asymmetrically, or the input/output bumps 21*a*, 21*b* may be formed to have differing dimensions and arranged asymmetrically.

It should be noted that, recently, along with size reductions and advanced functionality in liquid crystal displays and other electronic devices, size reductions and height reductions are desired in electronic components such as the liquid crystal driver IC 18 and height of the input/output bumps 21*a*, 21*b* is also reduced (to, for example, 6 to 15 μm).

Furthermore, on the mounting surface 18*a* of the liquid crystal driver IC 18, an IC-side alignment mark 32 is formed for performing alignment with respect to the transparent substrate 12 by superimposing with the substrate-side alignment mark 31. It should be noted that, due to progress in finer wiring pitches for the transparent electrodes 17 of the transparent substrate 12 and the input/output bumps 21*a*, 21*b* of the liquid crystal driver IC 18, high accuracy is desired in alignment of the liquid crystal driver IC 18 and the transparent substrate 12.

As the substrate-side alignment mark 31 and the IC-side alignment mark 32, a variety of marks can be used which can be combined together to align the transparent substrate 12 and the liquid crystal driver IC 18.

On the input/output terminals 19*a*, 19*b* of the transparent electrodes 17 formed on the mounting site 27, the liquid crystal driver IC 18 is connected using an anisotropic conductive film 1 as a circuit connecting-use adhesive. The anisotropic conductive film 1 contains conductive particles 4 and is for electrically connecting, via the conductive particles 4, input/output bumps 21*a*, 21*b* of the liquid crystal driver IC 18 to the input/output terminals 19*a*, 19*b* of the transparent electrodes formed on the mounting site 27 of the transparent substrate 12. In the anisotropic conductive film 1, thermocompression bonding with the thermocompression bonding head 33 causes the binder resin to flow, deforms the conductive particles 4 between input/output terminals 19*a*, 19*b* and the input/output bumps 21*a*, 21*b* of the liquid crystal driver IC 18 and cures the binder resin in this state. The anisotropic conductive film 1 thus mechanically and electrically connects the transparent substrate 12 and the liquid crystal driver IC 18.

Furthermore, on both the transparent electrodes 16, 17, an orientation film 24 that is subjected to a predetermined rubbing treatment is formed and an initial orientation of the liquid crystal molecules is regulated by this orientation film 24. Still further, a pair of polarizing plates 25, 26 are disposed on the outer surfaces of the transparent substrates 11, 12; these polarizing plates 25, 26 regulate the wave-direction of transmitted light from a light source such as a backlight (not illustrated).

Anisotropic Conductive Film

Figure 5:
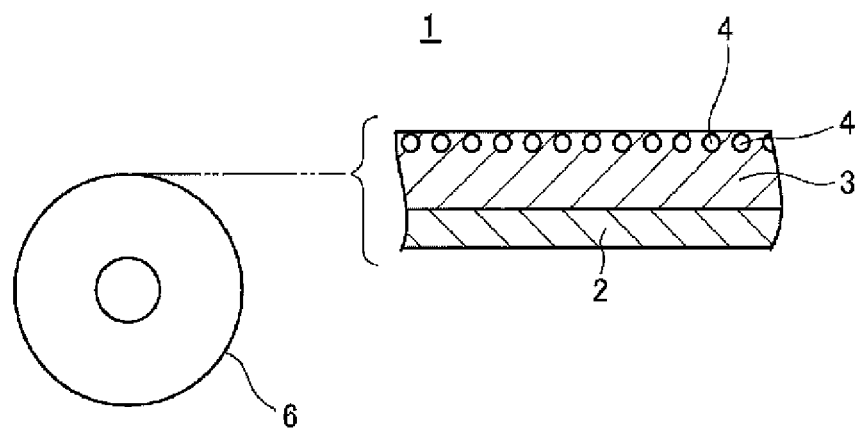
FIG. 5 is a cross-sectional view illustrating an anisotropic conductive film.

Next, the Anisotropic Conductive Film 1 will be described. In the anisotropic conductive film (ACF) 1, as illustrated in FIG. 5, typically, a binder resin layer (adhesive layer) 3 containing the conductive particles 4 is formed on a release-treated film 2 serving as a matrix material. The anisotropic conductive film 1 is an adhesive of a thermosetting-type or a photocurable-type such as by ultraviolet light and is pasted onto the input/output terminals 19*a*, 19*b*, which are formed on the transparent substrate 12 of the liquid crystal display panel 10, along with mounting the liquid crystal driver IC 18; flowing is caused by thermocompression-bonding by the thermocompression bonding head 33 and the conductive particles 4 are deformed between the respectively opposing input/output terminals 19*a*, 19*b* of the transparent electrodes 17 and the input/output bumps 21*a*, 21*b* of the liquid crystal driver IC 18; and heat is then applied or ultraviolet light is irradiated in order to cure the resin in a state in which the conductive particles are deformed. The anisotropic conductive film 1 is thus able to connect and conduct electricity between the transparent substrate 12 and the liquid crystal driver IC 18.

Further, in the anisotropic conductive film 1, in the binder resin layer 3 which contains, as typical, a film-forming resin, a thermosetting resin, a latent curing agent and a silane coupling agent, the conductive particles 4 are regularly arranged in a predetermined pattern.

The release-treated film 2 for supporting the binder resin layer 3 is formed by coating, for example, PET (polyethylene terephthalate), OPP (oriented polypropylene), PMP (poly-4-methylpentene-1), PTFE (polytetrafluoroethylene), among others, with a release agent such as silicone, and is for preventing drying of the anisotropic conductive film 1 and maintaining the shape of the anisotropic conductive film 1.

As the film-forming resin contained by the binder resin layer 3, a resin having an average molecular weight of approximately 10,000 to 80,000 is preferably used. Examples of film forming resin include epoxy resin, modified epoxy resin, urethane resin and phenoxy resin, among a wide variety of other resins. Among these, in view of such properties as resin-formed states and connection reliability, a phenoxy resin is particularly preferable.

Examples of thermosetting resins, without particular limitation, include commercially available epoxy resins and acrylic resins.

Examples of epoxy resin include, without particular limitation, naphthalene-type epoxy resin, biphenol-type epoxy resin, phenol-novolac type epoxy resin, bisphenol type epoxy resin, stilbene-type epoxy resin, triphenolmethane-type epoxy resin, phenol aralkyl-type epoxy resin, naphthol-type epoxy resin, dicyclopentadiene-type epoxy resin and triphenylmethane-type epoxy resin, among others. These may be used individually or in a combination of two or more.

Acrylic resin is without particular limitation and an acrylic compound and/or a liquid acrylate, among others, may be selected as appropriate according to purpose. Examples include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxy propane, 2,2-bis[4-(acryloxy)phenyl]propane, 2,2-bis[4-(acryloxy ethoxy)phenyl]propane, dicyclopentenyl acrylate, tricyclodecanyl acrylate, tris(acryloxyethyl) isocyanurate, urethane acrylate and epoxy acrylate, among others. It should be noted that methacrylate may be substituted for acrylate. These may be used individually or in a combination of two or more.

The latent curing agent is without particular limitation and examples include thermosetting and UV-curing types, among a variety of other types of curing agents. The latent curing agent does not react under normal conditions and a trigger including heat, light and/or pressure, among others, for activation/initiating a reaction can be selected according to need. Existing methods for activating a heat activated latent curing agent include methods in which active species (cations, anions and/or radicals) are generated by a dissociative reaction due to heat, methods in which the curing agent is stably dispersed in the epoxy resin, the curing agent becomes compatible with and dissolves in the epoxy resin at high temperatures and the curing reaction is initiated, methods in which a molecular sieve enclosed type curing agent is dissolved at a high temperature to initiate the curing reaction and methods in which microcapsules are dissolved to cure, among other methods. Examples of latent curing agents include imidazole-type, hydrazide-type, boron trifluoride-amine complexes, sulfonium salt, aminimide, polyamine salt and dicyandiamide, among others, and modified compounds of these; these may be used individually or in a combination of two or more. Among these, a microcapsule imidazole-type latent curing agent is particularly suitable.

The silane coupling agent is without particular limitation and examples include epoxy-type, amino-type, mercapto/sulfide-type, and ureido-type, among others. By adding the silane coupling agent, adhesion properties at interfaces between organic and inorganic materials can be improved.

Conductive Particles

Examples of conductive particles 4 usable in the anisotropic conductive film 1 include known conductive particles used in anisotropic conductive films. As the conductive particles 4, examples include particles of metals or metal alloys such as those of nickel, iron, copper, aluminum, tin, lead, chromium, cobalt, silver or gold and particles such as those of metal oxides, carbon, graphite, glass, ceramics and plastics coated with metal, or the above-mentioned particles further coated with a thin electrically-insulating film, among others. In the case of coating a metal to the surface of resin particles, examples of usable resin particles include epoxy resin, phenol resin, acrylic resin, acrylonitrile-styrene (AS) resin, benzoguanamine resin, divinylbenzene-type resin and styrene-type resin particles, among others. Size of the conductive particles 4 is preferably 1 to 10 μm; however, the present disclosure is not limited to this range.

Regular Arrangement of Conductive Particles

Figure 6:
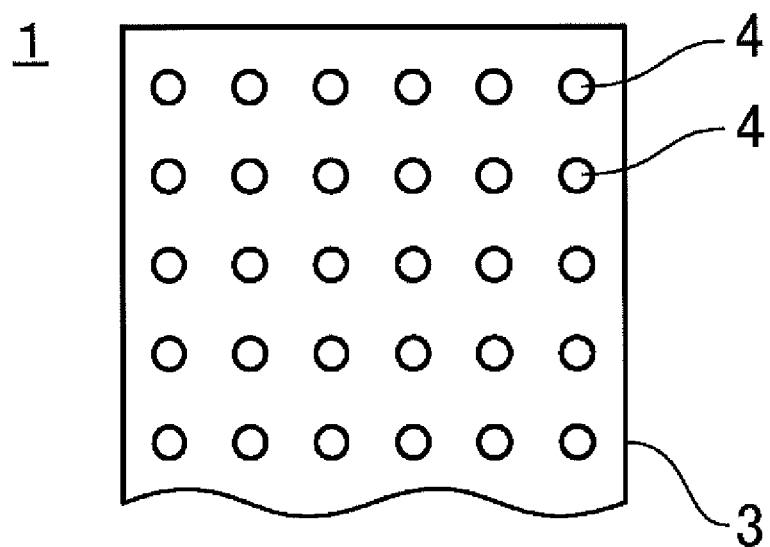
FIG. 6 is a plan view illustrating an anisotropic conductive film in which conductive particles are regularly arranged in a grid pattern.
Figure 7:
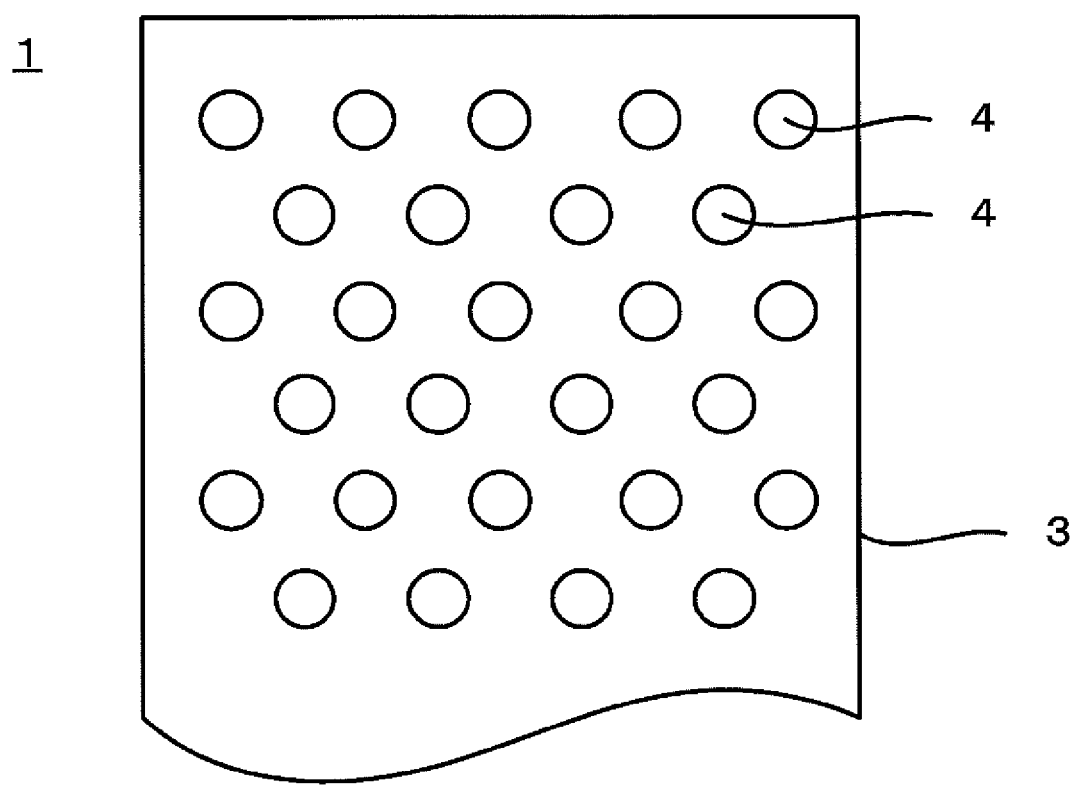
FIG. 7 is a plan view illustrating an anisotropic conductive film in which conductive particles are regularly arranged in a hexagonal lattice pattern.

In the anisotropic conductive film 1, the conductive particles 4 are arranged in a predetermined regular pattern as viewed from a planar perspective, for example as illustrated in FIGS. 6 and 7, in a uniformly spaced grid or a hexagonal lattice. Arrangement distance for such conductive particles 4 can be adjusted as appropriate. In this respect, the arrangement distance may differ in each arrangement direction. As described hereinbelow, in the anisotropic conductive film 1, by arranging the conductive particles 4 in a regular arrangement as viewed from a planar perspective, in comparison with the case of randomly dispersing the conductive particles 4, in inspection after connecting the liquid crystal driver IC 18, visibility of indentations 30 appearing in the input/output terminals 19a, 19b can be improved.

In contrast, in the case of randomly dispersing the conductive particles, respective particles become adjacent or overlapped when connecting and recognition of individual conductive particles after pressing becomes difficult.

By regularly arranging the conductive particles 4 as viewed from a planar perspective, in contrast with the case of randomly dispersing the conductive particles 4, even in conjunction with a reduced pitch of the space 23 between adjacent input/output bumps 21a, 21b, a reduced and narrowed inter-electrode surface area for the input/output bumps 21a, 21b of the liquid crystal driver IC 18, and filling the conductive particles 4 at a high density, in the connecting step of the liquid crystal driver IC 18, the anisotropic conductive film 1 can prevent short circuits in the space 23 between the input/output bumps 21a, 21b caused by agglomeration of the conductive particles 4.

Further, regularly arranging the conductive particles 4 in the anisotropic conductive film 1 prevents unevenness in density due to agglomeration of the conductive particles 4, even in the case of filling the conductive particles 4 into the binder resin layer 3 at a high density. Therefore, with the anisotropic conductive film 1, the conductive particles 4 can be trapped even when the input/output terminals 19a, 19b and the input/output bumps 21a, 21b have reduced pitches. The uniformly spaced pattern arrangement of the conductive particles 4 can be arbitrarily selected.

Such an anisotropic conductive film 1 can be manufactured by methods including, for example, methods of coating a pressure-sensitive adhesive onto a stretchable sheet and arranging the conductive particles 4 in a single layer before stretching the sheet to a selected draw ratio, methods of adjusting the conductive particles 4 into a selected pattern on a matrix material and subsequently transferring the conductive particles 4 to the binder resin layer 3 which is supported by the release-treated film 2, and methods of supplying the conductive particles 4 onto the binder resin layer 3 which is supported by the release-treated film 2 via an arrangement plate having openings corresponding to the pattern, among other methods.

It should be noted that the shape of the anisotropic conductive film 1 is without particular limitation, and, for example, as illustrated in FIG. 5, can have a long tape shape windable around a winding reel 6 that can be used by simply cutting to a selected length.

Although an embodiment has been described using, as the anisotropic conductive film 1, an exemplary film-formed adhesive film made from a thermosetting resin composition containing the binder resin layer 3 in which the conductive particles 4 were dispersed, the adhesive according to the present disclosure is not limited thereto, and, for example, a configuration is possible in which an insulating adhesive layer containing the binder resin 3 alone is laminated with a conductive particle-containing layer containing the binder resin 3 which contains the conductive particles 4 in a regular arrangement. Furthermore, in the anisotropic conductive film 1, as long as the conductive particles 4 are regularly arranged as viewed from a planar perspective, in addition to being arranged in a single layer as illustrated in FIG. 5, the conductive particles 4 may be regularly arranged as viewed from a planar perspective in a plurality of binder resin layers 3. Still further, in at least one layer of a multilayer structure of the anisotropic conductive film 1, the conductive particles 4 may be dispersed at a single, selected distance.

Connecting Step

A connecting step for connecting the liquid crystal driver IC 18 to the transparent substrate 12 will now be described in detail. First, the anisotropic conductive film 1 is temporarily pasted onto the mounting site 27 having the input/output terminals 19a, 19b of the transparent substrate 12 fainted thereon. Next, the transparent substrate 12 is placed on a stage of a connecting device and the liquid crystal driver IC 18 is positioned above the mounting site 27 of the transparent substrate 12 with the anisotropic conductive film 1 interposing therebetween.

Next, by using a thermocompression head 33 heated to a predetermined temperature for curing the binder resin layer 3 at a predetermined pressure and time, the liquid crystal driver IC 18 is thermocompression-bonded from above. The binder resin layer 3 of the anisotropic conductive film 1 thus exhibits flowability, and, while the binder resin layer 3 flows from between the mounting surface 18a of the liquid crystal driver IC 18 and the mounting site 27 of the transparent substrate 12, the conductive particles 4 within the binder resin layer 3 are sandwiched and deformed between the electrode terminals 19 of the input/output bumps 21a, 21b and the input/output terminals 19a, 19b of the transparent substrate 12.

Consequently, the input/output bumps 21a, 21b and the input/output terminals 19a, 19b are electrically connected by the conductive particles 4 being sandwiched therebetween and, in this state, heat is applied by a thermocompression head 33 to cure the binder resin. This enables manufacturing of the liquid crystal display panel 10 in which conduction is ensured between the input/output bumps 21a, 21b of the liquid crystal driver IC 18 and the input/output terminals 19a, 19b of the transparent substrate 12. Furthermore, the sandwiched conductive particles 4 described above which are pressed (deformed) become indentations in the input/output terminals 19a, 19b.

The conductive particles 4 which are not between the input/output bumps 21a, 21b and the input/output terminals 19a, 19b are dispersed within the binder resin in inter-terminal spaces 23 between adjacent input/output bumps 21a, 21b and maintained in an electrically insulated state. Therefore, in the liquid crystal display panel 10, electrical conduction only between the input/output bumps 21a, 21b of the liquid crystal driver IC 18 and the input/output terminals 19a, 19b of the transparent substrate 12 is achievable. It should be noted that, as the binder resin, by using a fast curing type radical polymerization-reaction type, it is possible to rapidly cure the binder resin with a short heating time. Additionally, the anisotropic conductive film 1 is not limited to thermosetting types and as long as pressure can be used in connection, a photosetting type or a thermo/photosetting type adhesive can be used.

Indentation Visibility

Indentations 30 caused by the conductive particles 4 being pressed between the input/output bumps 21a, 21b are observable from the transparent substrate 12 side at locations of the input/output terminals 19a, 19b. After connecting the liquid crystal driver IC 18, it is possible to inspect connection properties by visual observation (such as with a microscope) or by using a captured image from the back surface of the transparent substrate 12 (the side opposite to the input/output terminals 19a, 19b).

Figures 8A, 8B, 8C:
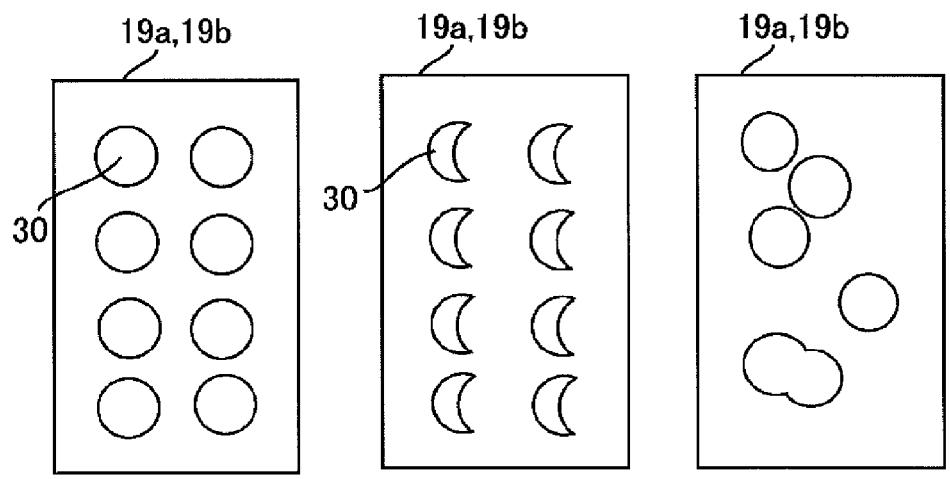
FIG. 8 is a plan view illustrating indentations appearing in terminals in the case of using (A) an anisotropic conductive film in which conductive particles are arranged, (B) an anisotropic conductive film in which conductive particles are arranged, and (C) an anisotropic conductive film in which conductive particles are randomly dispersed.

The indentations 30, which are pressing marks of the conductive particles 4 caused by pressing with the thermocompression head 33 in a state in which the conductive particles 4 having a high hardness are trapped between the input/output bumps 21a, 21b and the input/output terminals 19a, 19b, appear in input/output terminals 19a, 19b of the transparent electrodes 17 and are visible by observing from the back surface side of the transparent substrate 12. With respect to the shape of the indentations 30, the indentations 30 generally have a diameter equal to or larger than that of the conductive particles and, as illustrated in FIG. 8 (a), are approximately circular. In further regard to the shape of the indentations 30, as illustrated in FIG. 8 (b), typically, even in the cases in which one side is indistinct, a large portion is constituted by a curve. The curve in this case comprises 40% or more, preferably 50% or more and more preferably 60% or more of a circle; thus, it is sufficient that the curve be recognizable as approximately a circular shape. It should be noted that, in such cases as that of metal particles, there are cases including states in which the shape is linear.

In the indentations 30, pressing force applied to the particles causes contrast and diameter differences. Therefore, the indentations are an indicator for judging uniform application of pressing by the thermocompression head 33 to each of the input/output terminals 19a, 19b as well as each of the input/output terminals 19a, 19b.

In this respect, in a connection body connected by using an anisotropic conductive film in which the conductive particles 4 are randomly dispersed in the binder resin layer 3, as illustrated in FIG. 8 (c), the indentations 30 appear irregularly above the input/output terminals as well as in close proximity or overlapping so as to adversely affect visibility of the indentations 30, thus requiring more time and effort to ascertain conditions as well as leading to increased inspection time and decreased accuracy in judging the indentations 30. This would thus lead to conditions in which it is difficult to recognize the curves constituting the indentations 30. Furthermore, in the case of inspection using mechanical image processing, it is difficult to establish determination criteria with such poor visibility. Determination accuracy itself is thereby worsened. This is because the image appears to be a combination of straight lines depending on the resolution.

In contrast, because the liquid crystal display panel 10 of the present disclosure is formed by using the anisotropic conductive film 1 in which the conductive particles 4 are arranged, among the input/output terminals 19a, 19b, the conductive particles 4 are sandwiched in an arranged state, and, as illustrated in FIG. 8 (a), the indentations 30 regularly appear in a state of individual independence. Accordingly, in the indentations 30 appearing in the input/output terminals 19a, 19b, contrast or curves constituting the indentations 30 appear clearly, significantly improving visibility of individual indentations 30. In the liquid crystal display panel 10, rapid and accurate inspection of connection properties between the input/output bumps 21a, 21b as well as the input/output terminals 19a, 19b on the basis of the indentations 30 is thereby enabled.

Because it is possible to ensure visibility by contrast with the smooth surface in which the conductive particles 4 are absent, the individual indentations 30 appearing in the input/output terminals 19a, 19b, so long as appearing regularly, may be adjacent to each other; however, a predetermined distance between appearances of the indentations 30, for example, 0.2 times the outer diameter or more preferably 0.4 times the outer diameter of the indentations 30 is preferable. It should be noted that the case in which the above-described contrast with the smooth surface appearing due to the curves is included.

For one of the input/output terminals 19a, 19b, preferably 55% or more, more preferably 65% and still more preferably 75% or more of such indentations 30 exist independently. Independent existence of an indentation 30 indicates independent existence of one of the conductive particles 4 and non-independent existence indicates adjacency or overlapping. However, in the case of intentionally arranging a multitude of the conductive particles 4 together, the independence of these units is to be considered.

Figure 9:
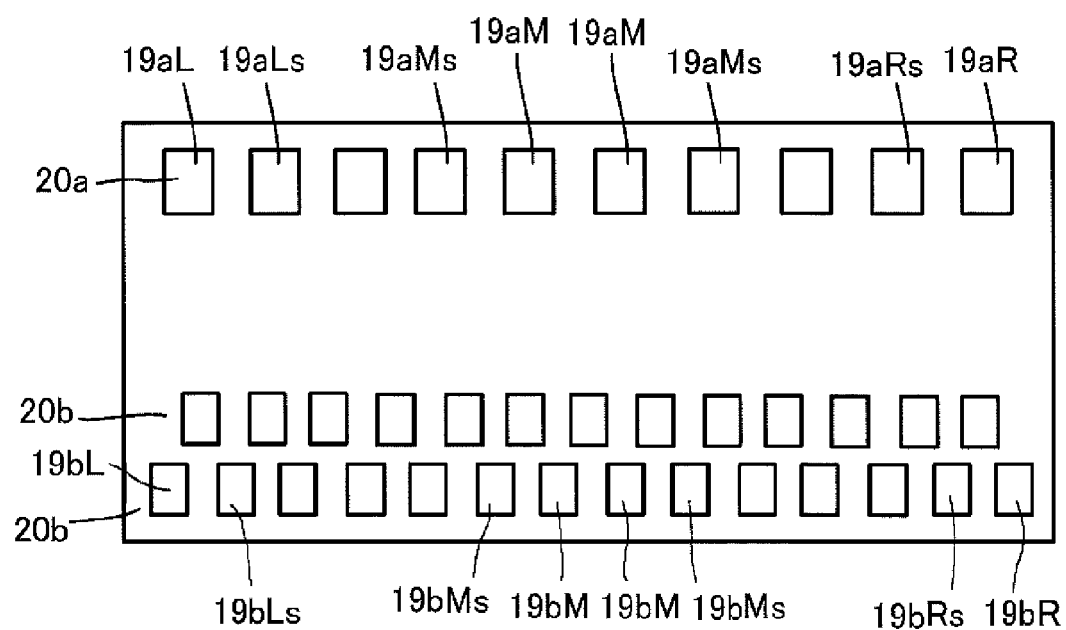
FIG. 9 is a plan view illustrating input/output terminal rows.

Furthermore, for central input/output terminals 19aM, 19bM of the input/output terminal rows 20a, 20b in which a plurality of the input/output terminals 19a, 19b are arranged, as illustrated in FIG. 9, preferably 55% or more, more preferably 65% or more and still more preferably 75% or more of the indentations 30 exist independently. It should be noted that in the case of an odd number of the input/output terminals 19a, 19b being arranged in the input/output terminal rows 20a, 20b, the central input/output terminals 19aM, 19bM refer to the center terminal of the relevant terminal row; in the case of an even number of the input/output terminals 19a, 19b being arranged in the input/output terminal rows 20a, 20b, the central input/output terminals 19aM, 19bM refer to the two central terminals of the relevant terminal row.

Similarly, for each terminal of input/output terminals 19aL, 19aR, 19bL and 19bR on both ends of the input/output terminal rows 20a, 20b in which a plurality of the input/output terminals 19a, 19b are arranged, as illustrated in FIG. 9, preferably 55% or more, more preferably 65% or more and still more preferably 75% or more of the indentations 30 exist independently. In the input/output terminals 19aL, 19aR, 19bL and 19bR on both ends, by 55% or more of the indentations 30 existing independently, all of the input/output terminals 19a, 19b of the relevant input/output terminal row 20a, 20b can be inferred to have similar visibility properties.

Furthermore, for each terminal of input/output terminals 19aMs, 19bMs adjacent to the central input output terminals 19aM, 19bM of the input/output terminal rows 20a, 20b having the plurality of the input/output terminals 19a, 19b as illustrated in FIG. 9, preferably 55% or more, more preferably 65% or more and still more preferably 75% or more of the indentations 30 exist independently. In the input/output terminals 19aMs, 19bMs adjacent to the central input/output terminals 19aM, 19bM, for each of the terminals, by 55% or more of the indentations 30 existing independently, similar visibility can be inferred not only for the center of the relevant terminal row but for all of the input/output terminals 19a, 19b for the entire row.

Yet furthermore, for each terminal of input/output terminals 19aLs, 19aRs, 19bLs and 19bRs adjacent to the input/output terminals 19aL, 19aR, 19bL and 19bR on both ends of the input/output terminal rows 20a, 20b in which the plurality of the input/output terminals 19a, 19b are arranged as illustrated in FIG. 9, preferably 55% or more, more preferably 65% or more and still more preferably 75% or more of the indentations 30 exist independently. By 55% or more of the indentations 30 existing independently for each terminal of the input/output terminals 19aL, 19aR, 19bL and 19bR on both ends and the input/output terminals 19aLs, 19aRs, 19bLs and 19bRs adjacent thereto, similar visibility is inferred for not only both ends of the relevant terminal row, but for all of the input/output terminals 19a, 19b for the entire row.

Furthermore, in all of the input/output terminals 19a, 19b of the input/output terminal rows 20a, 20b existing in parallel on the transparent substrate, similarly, preferably 55% or more, more preferably 65% or more and still more preferably 75% or more of the indentations 30 exist independently. By comparing indentations in respective terminals existing in parallel, uniformity of pressure applied by the thermocompression head 33 across the entire pressure application area can also be inspected.

In the input/output terminals 19a, 19b, in order to confirm electrical connection to the input/output bumps 21a, 21b, the indentations 30 preferably appear two or more times, more preferably three or more times and still more preferably four or more times in each of the input/output terminals 19a, 19b.

Regular appearance of the indentations 30 in at least one portion can serve as an indicator to enable simultaneous ascertainment of connection conditions in the region sandwiched by the input/output terminals 19a, 19b and the input/output bumps 21a, 21b as well as connection conditions in the inter-terminal space 23 between adjacent input/output bumps 21a, 21b of the binder resin when connecting the liquid crystal driver IC 18. Because the indentations 30 are in a state allowing good visibility, in occurrences affecting the condition of the input/output terminals 19a, 19b or binder resin in the surrounding vicinities such as lifting, the relevant occurrence, such as lifting, has differing transparency and can be easily compared to the indentations 30, which serve as an indicator. Furthermore, in the case of foreign material contamination within the connection body, the regular arrangement serves as an indicator allowing easy detection of foreign material and identification of the location thereof as well as ascertainment of the degree of impact caused thereby.

Sameness or Similarity of Indentation Arrangement in Respectively Neighboring Terminals In the liquid crystal display panel 10, among respectively neighboring input/output terminals 19a, 19b, a portion of the arrangement of the indentations 30 preferably has a sameness property or a similarity property. In the liquid crystal display panel 10, easy relative comparison of the indentations 30 and inspection judgement criteria determination as well as rapid and accurate judgment evaluation are thereby enabled. Particularly, in the case of visual inspection, for example, appearance of the indentations 30 in an arrangement having sameness or similarity among respectively neighboring input/output terminals 19a, 19b enables easy and rapid evaluation of mutual indentations. By repeating the above, applied pressure across the entire surface can be ascertained quickly and with high accuracy.

It should be noted that arrangement of the indentations 30 may be in straight lines; sameness means that the indentations arranged in a straight line appear at the same arrangement pitch and length and similarity includes indentations arranged in a straight line having an arrangement pitch and/or length which varies. A straight line in this case, in input/output terminals 19a, 19b having a fine pitch, is the minimum number of the indentations constituting a straight line, the smallest number, such as two, is considered to be an arrangement. Similarity means that there are variations in distance or spacing therein. In finer pitches, arrangements of trapped conductive particles can only be considered as straight lines or states nearing straight lines.

In the liquid crystal display panel 10, by using the anisotropic conductive film 1 in which the conductive particles 4 are regularly arranged, the conductive particles 4 are regularly positioned across neighboring input/output terminals 19a, 19b. When applying thermocompression with the thermocompression head 33 in this state, because flowability of the binder resin between neighboring input/output terminals 19a, 19b is approximately the same, the arrangement of the indentations 30 can have the sameness property or the similarity property.

Inter-Indentation Distance within One Terminal

In the indentations 30, inter-indentation distance between all indentations 30 within one input/output terminal 19a, 19b is preferably within ±30%, more preferably within 15% and still more preferably within 7% of an average inter-indentation distance. Inter-indentation distance between an indentation 30 and a proximal indentation 30 refers to the shortest distance to the nearest outer edge of an indentation 30 from the outer edge of the relevant indentation 30 and the average inter-indentation distance refers to the average value of the inter-indentation distances for all of the indentations 30 within one of the input/output terminals 19a, 19b. In the present disclosure, in an inspection step of the indentations 30, inspection of uniformity of pressure application within one of the input/output terminals 19a, 19b is thereby enabled.

Thus, for within one of the input/output terminals 19a, 19b, inter-indentation distances of all of the indentations 30 being within ±30% of the average inter-indentation distance is considered to indicate approximately uniform strength of applied pressure to the conductive particles 4, parallel pressing of the input/output bumps 21a, 21b and the input/output terminals 19a, 19b as well as low variance in electrical resistance among each of the input/output terminals 19a, 19b. Contrastingly, for within one of the input/output terminals 19a, 19b, inter-indentation distance for all of the indentations 30 exceeding ±30% is considered to indicate non parallel pressing of the input/output bumps 21a, 21b and the input/output terminals 19a, 19b, which is considered to lead to high variance in electrical resistance among each of the input/output terminals 19a, 19b.

Uniform Pressing within One Terminal Row

Furthermore, in the indentations 30, difference between average inter-indentation distance within one of the input/output terminals 19a, 19b and average inter-indentation distance within the central input/output terminals 19aM, 19bM of the terminal row in which the relevant input/output terminals 19a, 19b are arranged is preferably within ±30%, more preferably within 15% and still more preferably within 7%. In the present disclosure, in the inspection step of the indentations 30, inspection of uniformity of pressure application within of one of the input/output electrode rows 20a, 20b is thereby enabled. It should be noted that in the case of an odd number of the input/output terminals 19a, 19b being arranged in the input/output terminal rows 20a, 20b, the central input/output terminals 19aM, 19bM refer to the center terminal of the relevant terminal row; in the case of an even number of the input/output terminals 19a, 19b being arranged in the input/output terminal rows 20a, 20b, the central input/output terminals 19aM, 19bM refer to the two central terminals of the relevant terminal row.

Thus, in the input/output electrode rows 20a, 20b, in addition to the case in which the liquid crystal driver IC 18 and transparent substrate 12 are pressed in parallel, even in the case of warping, because the central input/output terminal 19aM, 19bM are most strongly pressed, visibility of indentations appearing therein is best, which can then be a standard for measuring uniformity of pressure application to the relevant terminal row.

Difference between average inter-indentation distance for one of the input/output terminals 19a, 19b and average inter-indentation distance for the central input/output terminals 19aM, 19bM of the input/output electrode rows 20a, 20b within ±30% indicates approximately the same pressure application force to the conductive particles 4 in the relevant input/output terminal 19a, 19b as in the central input/output terminal 19aM, 19bM of the terminal row as well as parallel pressing of the input/output bumps 21a, 21b such that electrical resistance variance with respect to other input/output terminals 19a, 19b can thereby considered to be low. In contrast, difference between average inter-indentation distance for one of the input/output terminals 19a, 19b and average inter-indentation distance for the central input/output terminal 19aM, 19bM of the input/output electrode rows 20a, 20b exceeding ±30% is considered to indicate non-parallel pressing of input/output bumps 21a, 21b of the relevant row and the relevant input/output terminals 19a, 19b from which electrical resistance variance among each of the other input/output terminals 19a, 19b can thereby be considered to be high. In this case, variance in electrical resistance includes effects of reliability tests such as in aging degradation.

Still further, for each of the input/output terminals 19a, 19b of the input/output electrode rows 20a, 20b existing in parallel on the transparent substrate 12, similarly, in the indentations 30, all of the indentations 30 within one of the input/output terminals 19a, 19b are preferably within ±30%, more preferably within 15% and still more preferably within 7% of average inter-indentation distance. In the input/output terminal rows 20a, 20b existing in parallel on the transparent substrate 12, difference between average inter-indentation distance within one input/output terminal 19a, 19b and the average inter-indentation distance for the central input/output terminal 19aM, 19bM of the input/output terminal rows 20a, 20b in which the relevant input/output terminals 19a, 19b are arranged is preferably within ±30%, more preferably within 15% and still more preferably within 7%. Thus, comparing indentations of respective terminal rows existing in parallel enables pressure application uniformity inspection across the entire surface.

Concave/Convex Portion

Figure 10:
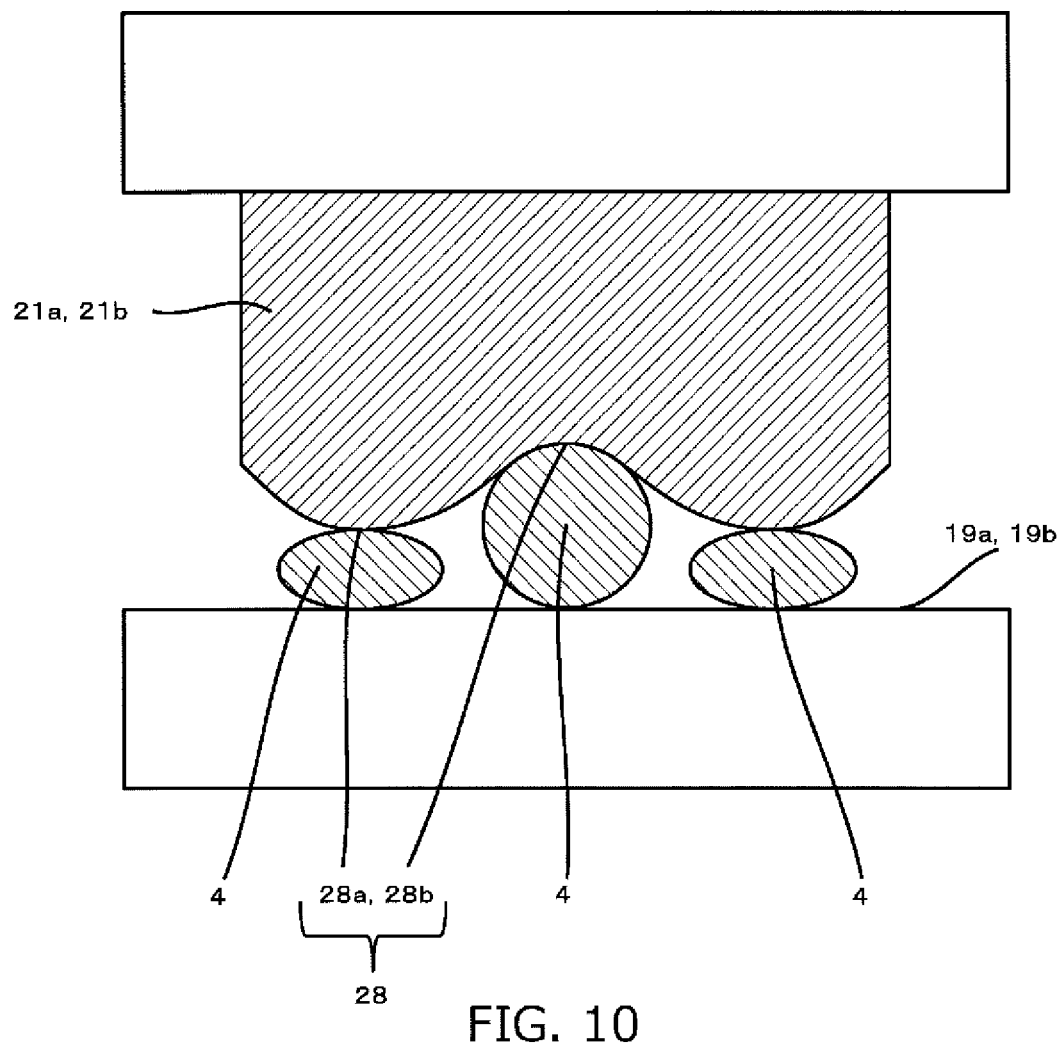
FIG. 10 is a cross-sectional view illustrating a state in which conductive particles are sandwiched between a terminal and a bump having a concave/convex portion formed thereon having a height difference within 50% of a particle diameter of the conductive particles.
Figure 11:
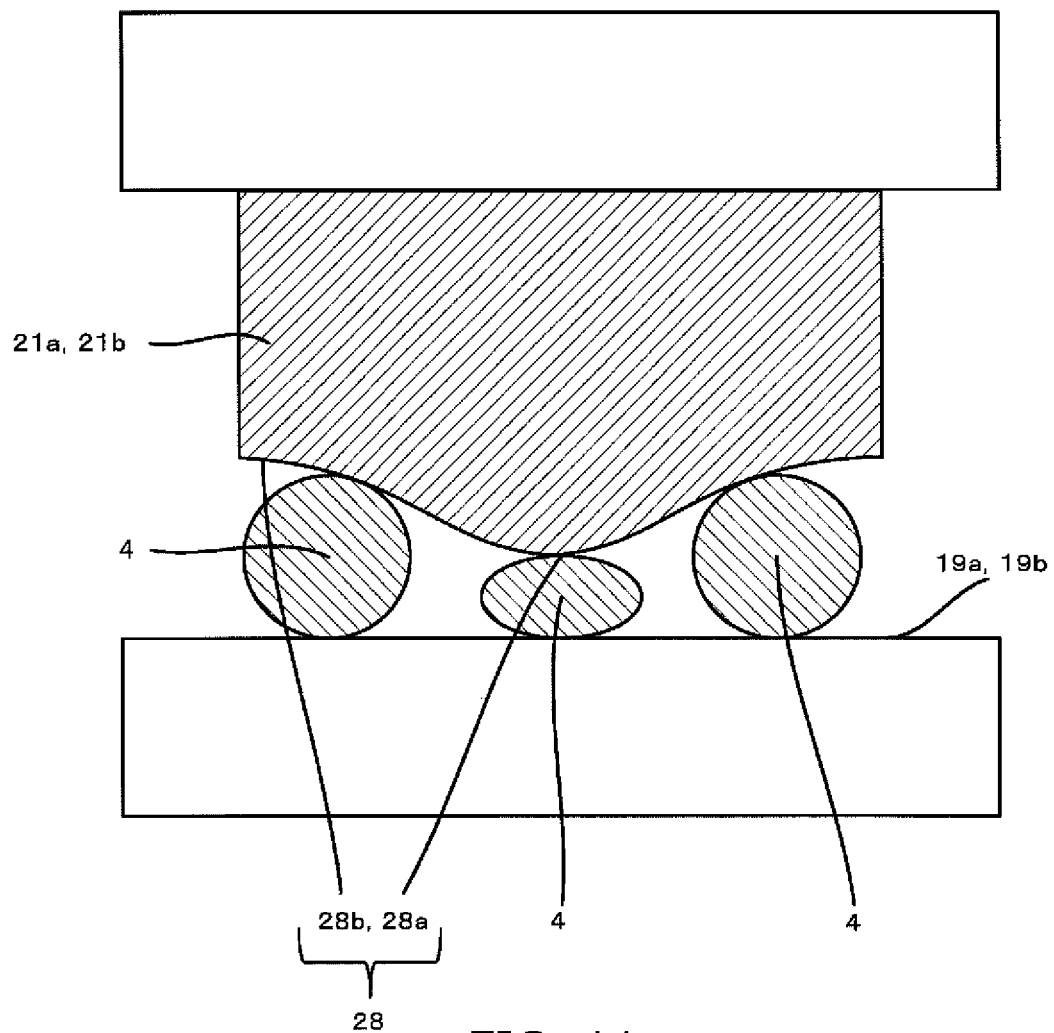
FIG. 11 is a cross-sectional view illustrating a state in which conductive particles are sandwiched between a terminal and a bump having a concave/convex portion formed thereon having a height difference within 50% of a particle diameter of the conductive particles.

In the input/output bumps 21a, 21b of the liquid crystal driver IC 18, on the surface for trapping the conductive particles 4, a concave/convex portion 28 having a height difference within 50% of the particle diameter of the conductive particles 4 may be provided. The concave/convex portion 28, for example, as illustrated in FIGS. 10 and 11, may be formed by projecting both side edges or by projecting a central portion of the surface trapping the conductive particles 4. Height difference of the concave/convex portion 28 is the difference between the highest convex portion 28a and the lowest concave portion 28b on the surface of the input/output bumps 21a, 21b.

The concave/convex portion 28 has a height difference which is within 50% of the particle diameter of conductive particles 4 before pressing. By selecting a height difference within 50% of particle diameter of the conductive particles 4, even in the case of trapping the conductive particles 4 with the concave portion 28b, the concave portion 28b can sufficiently press the conductive particles 4 while avoiding direct contact of the convex portion 28a with the input/output terminals 19a, 19b. Accordingly, input/output bumps 21a, 21b and the input/output terminals 19a, 19b are electrically connected by sandwiching the conductive particles 4 and favorable electrical connection reliability can be ensured even under changing environmental conditions after connection. It should be noted that on the surface of the input/output bumps 21a, 21b, even when providing the concave/convex portion 28 having a height difference within 50% of the particle diameter of the conductive particles 4, visibility of the indentations in the input/output terminals 19a, 19b is not particularly impacted and favorable visibility can be ensured.

Figure 12:
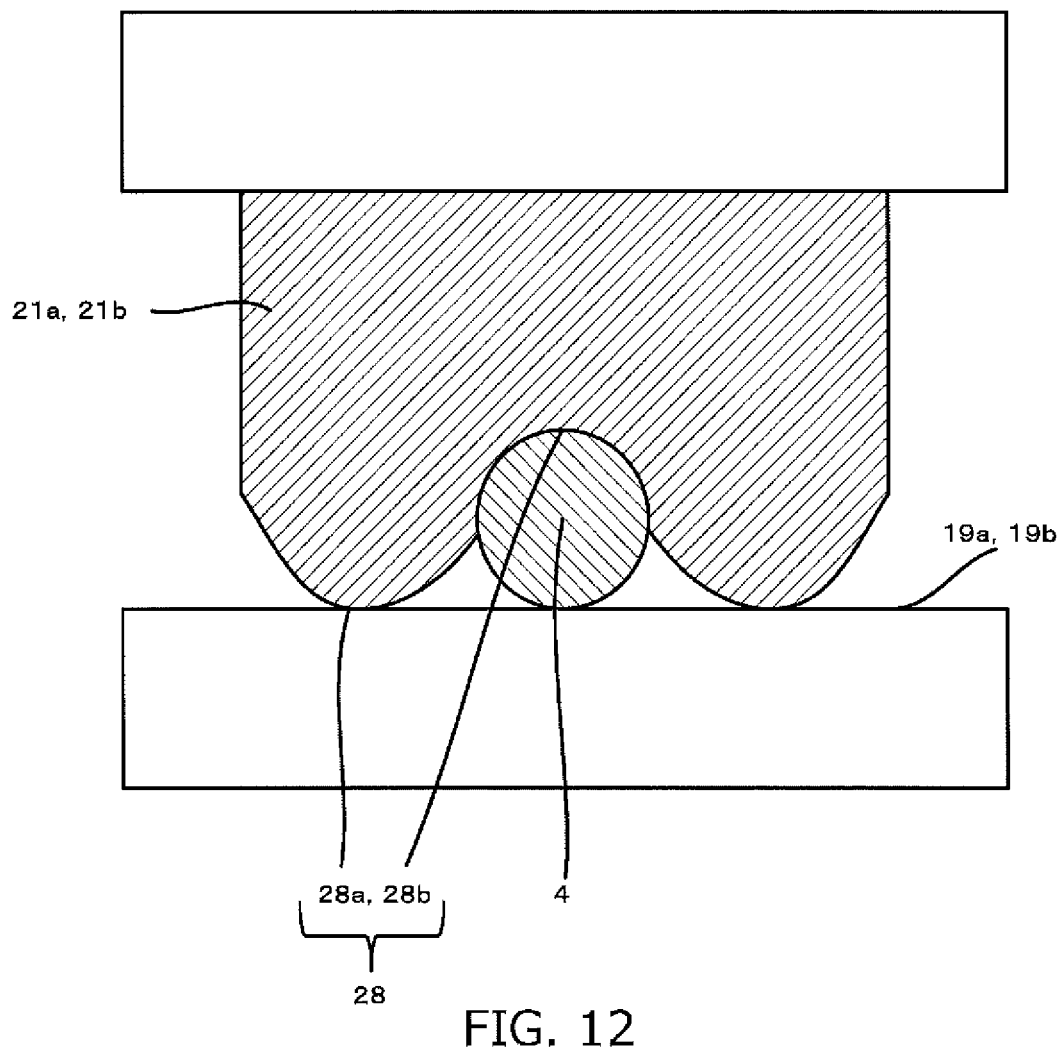
FIG. 12 is a cross-sectional view illustrating a state in which a conductive particle is sandwiched between a terminal and a bump having a concave/convex portion formed thereon having a height difference exceeding 50% of a particle diameter of the conductive particle.
Figure 13:
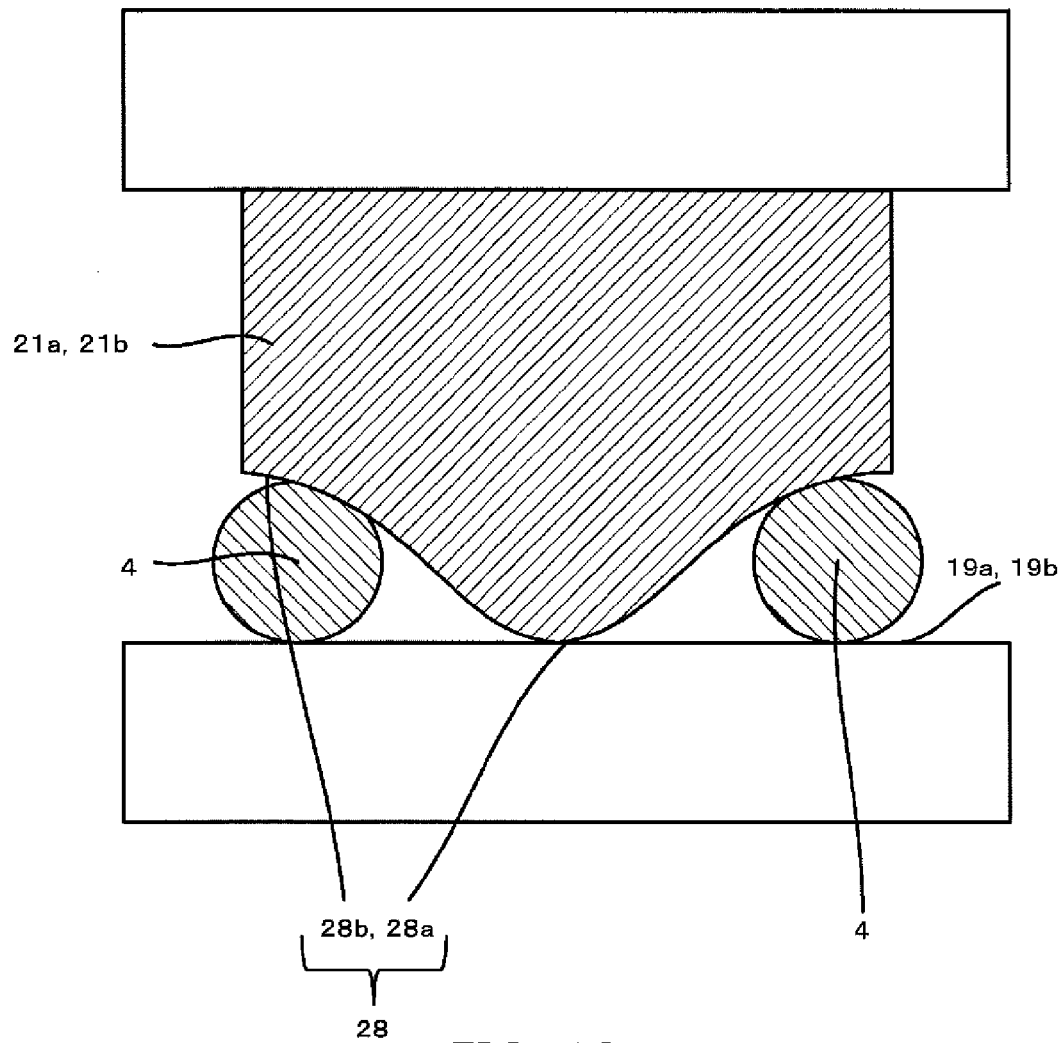
FIG. 13 is a cross-sectional view illustrating a state in which conductive particles are sandwiched between a terminal and a bump having a concave/convex portion formed thereon having a height difference exceeding 50% of a particle diameter of the conductive particles.

In contrast, if the height difference of the concave/convex portion 28 exceeds 50% of the particle diameter of the conductive particles 4 before pressing, as illustrated in FIGS. 12 and 13, in the case of trapping the conductive particles 4 with the concave portion 28b, pressing of the conductive particles 4 is insufficient, possibly leading to rises in electrical resistance, and by the convex portion 28a making direct contact with the input/output terminals 19a, 19b, low ability to withstand post-connection changes in distance between the input/output bumps 21a, 21b and the input/output terminals 19a, 19b might impair conduction reliability. It should be noted that FIG. 12 illustrates a conductive particle 4 in one example of a case of trapping in a concave portion 28b and also illustrates an example condition in which the conductive particle has embedded into the concave portion 28b side of the input/output bump 21a, 21b. Since hardness of the input/output bumps 21a, 21b depends on variances in material qualities thereof, in the compression bonding step, it is possible for the conductive particles 4 to embed into the input/output bumps 21a, 21b. In this case as well, post-connection ability to withstand changes in distance between the input/output bumps 21a, 21b and the input/output terminals 19a, 19b is low, which might impair conduction reliability.

EXAMPLES

First Examples

Next, a first set of examples according to the present disclosure will be described. In the first examples, anisotropic conductive films in which conductive particles were regularly arranged and anisotropic conductive films in which conductive particles were randomly dispersed were used to manufacture sample connection bodies in which an evaluation-use IC was connected to an evaluation-use glass substrate; number and independence of the indentations appearing in terminals of each of the evaluation-use glass substrates were evaluated and initial electrical resistance and inter-bump short circuit occurrence rates between adjacent IC bumps were measured.

Anisotropic Conductive Film

In the binder resin layer of the anisotropic conductive film used to connect the evaluation-use IC, 60 pts. mass of a phenoxy resin (trade name: YP-50, manufactured by NIPPON STEEL & SUMIKIN CHEMICAL CO., LTD.), 40 pts mass of an epoxy resin (trade name: jER828, manufactured by Mitsubishi Chemical Corporation) and 2 pts. mass of a cation-type curing agent (trade name: SI-60L, manufactured by SANSHIN CHEMICAL INDUSTRY CO., LTD.) were added to a solvent to prepare a binder resin composition, this binder resin composition was applied to a release-treated film and baked.

IC for Electrical Resistance Measurement

As an evaluation device, an IC for measuring electrical resistance was used; outer dimensions: 0.7×20 mm, thickness: 0.2 mm; bumps (Au-plated), width: 15 μm, length: 100 μm, height: 12 μm.

IC Inter-Bump Short Circuit Evaluation-Use IC

As an evaluation element for evaluating IC inter-bump short circuits, an evaluation-use IC was used; outer dimensions: 0.7×20 mm, thickness: 0.2 mm; bumps (AU-plated), width: 15 μm, length: 100 μm, height: 12 μm, inter-bump space width: 7.5 μm.

Evaluation-Use Glass Substrate

As an evaluation-use glass substrate to which the evaluation-use ICs for measuring electrical resistance and the evaluation-use ICs for measuring inter-bump short circuits were connected, an ITO patterned glass was used which had outer dimensions of 30×50 mm and a thickness of 0.5 mm and on which rows having pluralities of terminals having a terminal pitch and size equivalent to the bumps of the evaluation-use ICs for measuring electrical resistance.

The anisotropic conductive films were temporarily pasted to these evaluation-use glass substrates before mounting and thermocompression bonding the evaluation-use ICs while keeping alignment between the IC bumps and the substrate electrodes; a thermocompression head was used to apply thermocompression with conditions of 180° C., 80 MPa, and 5 seconds to manufacture sample connection bodies. For each of the connection body samples, numbers of indentations appearing in the IC bumps as well as initial electrical resistance and the short circuit occurrence rate between adjacent IC bumps were measured.

For independence of the indentations appearing in the terminals of the evaluation-use glass substrate, for each of the connection bodies having a connected evaluation-use IC for measuring electrical resistance, terminals in which a plurality of indentations appear were observed from the back surface of the evaluation-use glass substrate, and the number of indentations which were not independent were counted for 1000 indentations.

Furthermore, the number of indentations appearing within one terminal of the evaluation-use glass substrate was visually observed and were counted by processing a captured image with an image processing device (WinRoof produced by MITANI Corporation) to each find the average number per electrode for 50 substrate electrodes.

In order to confirm uniform pressing of the evaluation-use IC, as illustrated in FIG. 9, among two of the output terminal rows 20b, for the central output terminal 19bM of the outer output terminal row 20b, the output terminals 19bMs adjacent to the central output electrode 19bM, the output terminals 19bL and 19bR on both ends and the output terminals 19bLs and 19bRs adjacent to the output terminals 19bL and 19bR on both ends were evaluated to determine whether 75% or more of the indentations appearing within each of the terminals were independent. If the terminal 19bM in the center of a row and terminals 19bL and 19bR on both ends of the row were pressed at the same time, it can be determined that other terminals in the same row were also pressed at approximately the same time. Furthermore, if the terminals 19bMs adjacent to the terminals 19bM in the center of a row and the terminals 19bLs and 19bRs adjacent to the terminals on both ends of a terminal row are pressed at the same time, uniformity can be evaluated as higher. The above is one example of a simple method.

It should be noted that there are an even number of output terminals in the outer output terminal row 20b, the central terminals were the middle two output terminals; observed area for each portion of the terminals on both ends of the electrode row and the terminals adjacent to the terminals on both ends and the terminals adjacent to the central terminals were the same.

Electrical resistance was measured for initial connection and after a reliability test; initial electrical resistances of 1.0Ω, or less and post-reliability test electrical resistances of 6Ω or less were evaluated as favorable. Conditions for the reliability test were 85° C., 85% RH, and 500 hours. Moreover, inter-IC bump short circuit occurrence rates of less than 50 ppm were evaluated as favorable.

Example 1

In Example 1, an anisotropic conductive film was used in which conductive particles were regularly arranged in the binder resin layer. The anisotropic conductive film used in Example 1 was manufactured by coating a pressure-sensitive adhesive onto a stretchable sheet and arranging the conductive particles in a single layer thereon before stretching the sheet to a selected draw ratio and, in this state, laminating the binder resin layer. Conductive particles (trade name: AUL704, manufactured by Sekisui Chemical Co., Ltd.) having a diameter of 4 μm were arranged at a pre-connection inter-particle distance of 0.5 μm and at a particle number density of 28,000 particles/mm$^2$.

Example 2

Example 2 used an anisotropic conductive film in which pre-connection inter-particle distance was 1 μm, particle number density was 16,000 particles/mm$^2$ with other conditions being the same as in Example 1.

Example 3

Example 3 used an anisotropic conductive film in which pre-connection inter-particle distance was 1.5 μm, particle number density was 10,500 particles/mm$^2$ with other conditions being the same as in Example 1.

Example 4

Example 4 used an anisotropic conductive film in which pre-connection inter-particle distance was 3 μm, particle number density was 5,200 particles/mm$^2$ with other conditions being the same as in Example 1.

Example 5

In Example 5, conductive particles (trade name: AUL703, manufactured by Sekisui Chemical Co., Ltd.) having a diameter of 3 μm were used and manufacturing was performed as in Example 1 to obtain an anisotropic conductive film in which pre-connection inter-particle distance was 0.5 μm; particle number density was 50,000 particles/mm$^2$.

Comparative Example 1

In Comparative Example 1, conductive particles were dispersed in the binder resin composition and this was applied to a release-treated film and baked to obtain an anisotropic conductive film in which the conductive particles were randomly dispersed. Conductive particles (trade name: AUL704, manufactured by Sekisui Chemical Co., Ltd.) having a diameter of 4 μm were used at a particle number density of 100,000 particles/mm$^2$.

Comparative Example 2

In Comparative Example 2, the particle number density was 60,000 particles/mm$^2$ with other conditions being the same as in Comparative Example 1.

TABLE 1

| | | Ex. 1 | Ex. 2 | Ex. 3 | Ex. 4 | Ex. 5 | Comp. 1 | Comp. 2 |
|---|---|---|---|---|---|---|---|---|
| Particle Number Density (particles/mm$^2$) | | 28000 | 16000 | 10500 | 5200 | 50000 | 10500 | 60000 |
| Conductive Particle Diameter (μm) | | 4.0 | 4.0 | 4.0 | 4.0 | 3.0 | 4.0 | 4.0 |
| Conductive Particle Arrangement | | Uniform | Uniform | Uniform | Uniform | Uniform | Random | Random |
| Impression Independence (per 1000) | | 5 | 4 | 2 | 1 | 6 | 104 | 232 |
| Indentations within One | Visual | 35 | 18 | 12 | 7 | 65 | 5 | 38 |
| Terminal | Image Proc. | 33 | 17 | 11 | 7 | 63 | 3 | 27 |
| Independence of 75% or More | Central | OK | OK | OK | OK | OK | NG | NG |
| Indentations | Adj. to Central | OK | OK | OK | OK | OK | NG | NG |
| | Ends | OK | OK | OK | OK | OK | NG | NG |
| | Adj. to Ends | OK | OK | OK | OK | OK | NG | NG |
| Electrical Resistance (Ω) | Post-Connection Initial | 0.2 | 0.2 | 0.3 | 0.4 | 0.2 | 0.8 | 0.2 |
| | After Reliability Test | 2.4 | 2.8 | 2.7 | 3.4 | 2.5 | 6.4 | 2.8 |
| Inter-IC bump Short Circuit Occurrence Rate (ppm) | | 50 or less | 50 or less | 50 or less | 50 or less | 50 or less | 50 or less | 50 or less |

As represented in Table 1, in the connection body samples of Comparative Example 1 and Comparative Example 2, 104 (Comparative Example 1) and 232 (Comparative Example 2) among 1000 indentations were adjacent or overlapping which was 10% or more and visibility was observed to be poor. In contrast, in the connection body samples of Examples 1 to 5, adjacencies and overlaps were two orders of magnitude lower than the comparative examples and visibility was observed to be good. It should be noted that independence of the indentations was worsened in proportion with the number density of the conductive particles in both the examples and comparative examples.

When comparing the number of indentations within one terminal visually and with the image processing device, difference between the counts was large in each of the comparative examples and the difference was small in each of the examples. In this regard, by the indentations of the comparative example being adjacent or overlapping, independence of individual indentations was low and multiple indentations were counted as one indentation such that distinguishability was observed to be poor. In contrast, because there were nearly no adjacent or overlapping indentations in the examples, a difference did not occur between visual observation and the image processing device. Consequently, it can be understood that individual indentations can be easily distinguished and accuracy improved.

As to the independence of 75% or more of the individual indentations appearing within each terminal of the central terminals of a terminal row, the terminals adjacent to the central terminals, the terminals on both ends and the terminals adjacent to the terminals on both ends, neither independence of 75% or more individual indentations for any of the terminals nor conditions facilitating visibility were obtained in the comparative examples and both independence of 75% or more individual indentations for all of the terminals as well as conditions facilitating visibility were obtained in the examples.

In the sample connection bodies of these examples, initial electrical resistances and post-reliability test electrical resistances were 1Ω or less and inter IC-bump short circuit occurrence rates were 50 ppm or less. Thus, from the sample connection bodies of the examples, it can be understood that by inspecting indentations in the four to eight terminals of the central terminals and terminals disposed on both end portions of a terminal row, uniformity of pressure application to the terminal row can be confirmed.

It should be noted that for the sample connection bodies of each example, the terminal row (input terminal row 20a), which was parallel to the row in which independence of indentations was observed and which was formed on a side edge of the substrate opposite to the side edge on which the terminal row for which the independence of indentations was observed, was similarly observed; similarly, 75% or more of the indentations appearing within each of terminals of the central terminals of the terminal row, the terminals adjacent to the central terminals, the terminals on each end and the terminals adjacent to the terminals on each end were independent. Thus, from the sample connection bodies of each of the examples, it can be understood that uniform pressure application across the entire area of pressure application of the evaluation-use IC was achieved.

Second Examples

Next, a second set of examples according to the present disclosure will be described. In the second examples, anisotropic conductive films in which conductive particles were regularly arranged and anisotropic conductive films in which conductive particles were randomly dispersed as well as evaluation-use ICs having bumps on the surface of which concave/convex portions having a height of less than 50% of the particle diameter of the conductive particles were formed to manufacture sample connection bodies in which evaluation-use ICs were connected to evaluation-use glass substrates; number and independence of the indentations appearing in terminals of each of the evaluation-use glass substrates were evaluated and initial as well as post-reliability test electrical resistances and inter-bump short circuit occurrence rates between adjacent IC bumps were measured.

The evaluation ICs for both electrical resistance measurement and inter-bump short circuit measurement used in the second examples, excepting the formation of the concave/convex portion having a height difference of less than 50% of the particle diameter of the conductive particles on input/output bump surfaces, were the same as in the first examples. Moreover, the anisotropic conductive film and the evaluation-use glass substrate were the same as in the first examples.

Furthermore, evaluation positions and evaluation criteria for number counts and independence of indentations appearing in the terminals of the evaluation-use glass substrate were the same as in the first examples. It should be noted that in the second examples, numbers of indentations appearing within one terminal on the evaluation-use glass substrate were counted visually. Additionally, evaluation criteria for electrical resistance and inter-bump short circuit occurrence rates and conditions for the reliability test were the same as in the first examples.

Examples 6 to 10

In Example 6, the anisotropic conductive film of Example 1 was used; in Example 7, the anisotropic conductive film of Example 2 was used; in Example 8, the anisotropic conductive film of Example 3 was used; in Example 9, the anisotropic conductive film of Example 4 was used; in Example 10, the anisotropic conductive film of Example 5 was used.

Comparative Examples 3 and 4

Comparative Example 3 used the anisotropic conductive film of Comparative Example 1 and Comparative Example 4 used the anisotropic conductive film of Comparative Example 2.

TABLE 2

| | | Ex. 6 | Ex. 7 | Ex. 8 | Ex. 9 | Ex. 10 | Comp. 3 | Comp. 4 |
|---|---|---|---|---|---|---|---|---|
| Particle Number Density (particles/mm$^2$) | | 28000 | 16000 | 10500 | 5200 | 50000 | 10500 | 60000 |
| Conductive Particle Diameter (μm) | | 4.0 | 4.0 | 4.0 | 4.0 | 3.0 | 4.0 | 4.0 |
| Conductive Particle Arrangement | | Uniform | Uniform | Uniform | Uniform | Uniform | Random | Random |
| Impression Independence (per 1000) | | 10 | 5 | 4 | 3 | 17 | 121 | 265 |
| Indentations within One Terminal | Visual | 25 | 12 | 8 | 4 | 39 | 2 | 20 |
| Independence of 75% or More Indentations | Central | OK | OK | OK | OK | OK | NG | NG |
| | Adj. to Central | OK | OK | OK | OK | OK | NG | NG |
| | Ends | OK | OK | OK | OK | OK | NG | NG |
| | Adj. to Ends | OK | OK | OK | OK | OK | NG | NG |
| Electrical Resistance (Ω) | Post-Connection Initial | 0.2 | 0.2 | 0.3 | 0.4 | 0.2 | 1.4 | 0.2 |
| | After Reliability Test | 2.2 | 2.6 | 2.9 | 3.8 | 2.4 | 12.1 | 2.7 |
| Inter-IC bump Short Circuit Occurrence Rate (ppm) | | 50 or less | 50 or less | 40 or less | 30 or less | 50 or less | 50 or less | 200 or less |

As represented in Table 2, even in the case of using the evaluation-use ICs having bumps on the surface of which concave/convex portions having a height of less than 50% of the particle diameter of the conductive particles were formed, similar tendencies appeared as in the first examples. Thus, in the connection body samples of Comparative Example 3 and Comparative Example 4, 121 (Comparative Example 3) and 265 (Comparative Example 4) among 1000 indentations were adjacent or overlapping which was at least 10% and visibility was observed to be poor. In contrast in the connection body samples of Examples 6 to 10, adjacencies and overlaps were one order of magnitude lower than the comparative examples and visibility was observed to be good. It should be noted that independence of the indentations was worsened proportionately with the number density of the conductive particles in both the Examples and Comparative Examples.

As to the independence of 75% or more of the individual indentations appearing within each terminal of the central terminals of a terminal row, the terminals adjacent to the central terminals, the terminals on both ends and the terminals adjacent to the terminals on both ends, neither independence of 75% or more individual indentations for any of the terminals nor conditions facilitating visibility were obtained in the comparative examples and both independence of 75% or more individual indentations for all of the terminals as well as conditions facilitating visibility were obtained in the examples.

In the sample connection bodies of these examples, initial electrical resistances and post-reliability test electrical resistances were 1Ω or less and inter IC-bump short circuit occurrence rates were 50 ppm or less. Thus, from the sample connection bodies of the examples, it can be understood that by inspecting indentations in the four to eight terminals of the central terminals and terminals disposed on both end portions of a terminal row, uniformity of pressure application to the terminal row can be confirmed.

It should be noted that the Comparative Example 4 in comparison with Comparative Example 2 of Table 1, despite both having conductive particles randomly dispersed in the resin, IC inter-bump short circuit occurrence rates were significantly different. In the case of randomly dispersing the conductive particles, it can be understood that uneven conductive particle distribution leads to IC inter-bump short circuit occurrence rate variance. Thus, it can be understood that regular arrangement of the conductive particles suppresses IC inter-bump short circuit occurrence rates.

It should be noted that for the sample connection bodies of each example, the terminal row (input/output terminal row 20a), which was parallel to the row in which independence of indentations was observed and which was formed on a side edge of the substrate opposite to the side edge on which the terminal row for which the independence of indentations was observed, was similarly observed; similarly, 75% or more of the indentations appearing within each of terminals of the central terminals of the terminal row, the terminals adjacent to the central terminals, the terminals on each end and the terminals adjacent to the terminals on each end were independent. Thus, from the sample connection bodies of each of the examples, it can be understood that uniform pressure application across the entire area of the evaluation-use IC was achieved.

REFERENCE SIGNS LIST 1 anisotropic conductive film, 2 release-treated film, 3 binder resin layer, 4 conductive particles, 6 winding reel, 10 liquid crystal display panel, 11, 12 transparent substrate, 12a edge area, 13 seal, 14 liquid crystal, 15 panel display unit, 16, 17 transparent electrodes, 18 liquid crystal driver IC, 18a mounting surface, 19a input terminals, 19b output terminals, 20a input terminal row, 20b output terminal row, 21a input bump, 21b output bump, 22a input bump row, 22b output bump row, 23 inter-terminal space, 27 mounting site, 31 substrate-side alignment mark, 32 IC-side alignment mark, 23 inter-terminal space, 33 thermocompression head

The invention claimed is:
1. A connection body comprising:
a transparent substrate; and
an electronic component connected to the transparent substrate via an anisotropic conductive adhesive;
wherein the transparent substrate has terminals on which a plurality of indentations caused by conductive particles contained in the anisotropic conductive adhesive are arranged in an in-plane direction of the terminals, and
wherein the indentations clearly appear and are visually distinguishable from peripheral portions.
2. The connection body according to claim 1, wherein in the terminals which are neighboring each other of the transparent substrate, the indentations have a sameness property or a similarity property.
3. The connection body according to claim 1, wherein:
the transparent substrate has a terminal row in which a plurality of the terminals are arranged;
wherein in the terminal row, 55% or more of the indentations exist independently within a central terminal.
4. The connection body according to claim 3, wherein the indentations do not overlap within a same terminal of the terminals.
5. The connection body according to claim 3, wherein, within the terminals, a difference in distances between outside edges of the indentations to nearest other indentations is within ±30% of an average within a same terminal.
6. The connection body according to claim 1, wherein:
the transparent substrate has a terminal row in which a plurality of the terminals are arranged;
wherein in the terminal row, 55% or more of the indentations exist independently within terminals on both ends.
7. The connection body according to claim 6, wherein the indentations do not overlap in a same terminal of the terminals.
8. The connection body according to claim 6, wherein, within the terminals, a difference in distances between outside edges of indentations to nearest other indentations is within ±30% of average in a same terminal.
9. The connection body according to claim 1, wherein:
the transparent substrate has a terminal row in which a plurality of the terminals are arranged;
wherein in the terminal row, 55% or more of the indentations exist independently within terminals adjacent to a central terminal.
10. The connection body according to claim 9, wherein the indentations do not overlap in a same terminal of the terminals.
11. The connection body according to claim 9, wherein, within the terminals, a difference in distances between outside edges of indentations to nearest other indentations is within ±30% of average in a same terminal.
12. The connection body according to claim 1, wherein:
the transparent substrate has a terminal row in which a plurality of the terminals are arranged;

wherein in the terminal row, 55% or more of the indentations exist independently within terminals adjacent to terminals on both ends.

13. The connection body according to claim 12, wherein the indentations do not overlap in a same terminal of the terminals.

14. The connection body according to claim 12, wherein, within the terminals, a difference in distances between outside edges of indentations to nearest other indentations is within ±30% of average in a same terminal.

15. The connection body according to claim 1, wherein, within terminals within a terminal row existing in parallel on the transparent substrate with a terminal row in which a plurality of the terminals are arranged, 55% or more of the indentations exist independently.

16. The connection body according to claim 15, wherein the indentations do not overlap in a same terminal of the terminals.

17. The connection body according to claim 15, wherein, within the terminals, a difference in distances between outside edges of indentations to nearest other indentations is within ±30% of average in a same terminal.

18. The connection body according to claim 1, wherein bumps of the electronic component connected to the terminals of the transparent substrate have a concave/convex portion having a height difference within 50% of a particle diameter of the conductive particles on a surface for trapping the conductive particles.

19. A method for manufacturing a connecting body comprising:
    mounting an electronic component onto a circuit substrate via an adhesive containing conductive particles; and
    pressing the electronic component against the circuit substrate and curing the adhesive, thereby connecting the electronic component onto the circuit substrate;
    wherein the anisotropic conductive adhesive has conductive particles arranged in a binder resin;
    wherein the transparent substrate has terminals on which a plurality of indentations caused by the conductive particles are arranged in an in-plane direction of the terminals, and
    wherein the indentations clearly appear and are visually distinguishable from peripheral portions.

20. An inspection method for inspecting a connection condition of a connection body in which an electronic component is connected onto a transparent substrate via an anisotropic conductive adhesive in which conductive particles are arranged comprising:
    comparing indentations of the conductive particles contained by the anisotropic conductive adhesive appearing in terminals of the transparent substrate and a surrounding area of the indentations.

21. The method according to claim 19, further comprising an inspection step of inspecting the indentations to determine connection properties between the terminals and the transparent substrate.

* * * * *